(12) United States Patent
Nygaard et al.

(10) Patent No.: US 12,651,101 B1
(45) Date of Patent: **\*Jun. 9, 2026**

(54) REALISM IN LOG-BASED SIMULATIONS

(71) Applicant: Waymo LLC, Mountain View, CA (US)

(72) Inventors: Carl Nygaard, Sunnyvale, CA (US); Zhenzhen Liu, Santa Clara, CA (US); Constantin Scholl, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 121 days.

This patent is subject to a terminal disclaimer.

(21) Appl. No.: 18/738,778

(22) Filed: Jun. 10, 2024

Related U.S. Application Data

(63) Continuation of application No. 17/104,016, filed on Nov. 25, 2020, now Pat. No. 12,030,509.

(51) Int. Cl.
*G06F 30/20* (2020.01)
*B60W 60/00* (2020.01)

(52) U.S. Cl.
CPC ........... *G06F 30/20* (2020.01); *B60W 60/001* (2020.02); *B60W 2520/10* (2013.01); *B60W 2552/10* (2020.02); *B60W 2552/53* (2020.02)

(58) Field of Classification Search
CPC .. B60W 50/06; B60W 30/09; B60W 30/0956; B60W 30/18163; B60W 60/0015; B60W 60/0053; B60W 2520/10; B60W 2552/10; B60W 2552/53; B60W 2554/4026; B60W 60/001; G06F 30/20
See application file for complete search history.

(56) References Cited

U.S. PATENT DOCUMENTS

| | | | |
|---|---|---|---|
| 10,042,359 B1 | 8/2018 | Konrardy et al. | |
| 10,460,411 B2 | 10/2019 | Liu | |
| 10,795,804 B1 * | 10/2020 | Nygaard ............. | G06F 11/3698 |
| 10,830,605 B1 | 11/2020 | Chintakindi et al. | |
| 10,964,192 B1 | 3/2021 | Lecocke et al. | |
| 11,037,227 B1 | 6/2021 | Padilha et al. | |
| 11,126,763 B1 | 9/2021 | Gabrovski et al. | |
| 11,208,099 B2 | 12/2021 | Kindo et al. | |
| 11,214,145 B2 | 1/2022 | Miller et al. | |
| 11,215,468 B2 | 1/2022 | Sugimura et al. | |
| 11,215,982 B2 | 1/2022 | Urano et al. | |
| 11,415,997 B1 * | 8/2022 | Dolan ................. | G06F 11/3688 |
| 11,551,414 B2 * | 1/2023 | Behar ................ | G06V 10/7753 |
| 11,702,106 B1 | 7/2023 | Poubel Orenstein et al. | |
| 11,741,274 B1 * | 8/2023 | Crego .................... | G06N 3/047 703/8 |

(Continued)

*Primary Examiner* — Peter D Nolan
(74) *Attorney, Agent, or Firm* — Botos Churchill IP Law

(57) ABSTRACT

The technology relates to generating simulations in order to evaluate software used to control vehicles in an autonomous driving mode. In one example, an initial situation involving a certain kind of interaction between a vehicle operating in the autonomous driving mode and an object may be identified. A search of log data may be conducted in order to identify one or more similar situations based on characteristics of the initial situation. A new simulation may be generated using the identified one or more similar situations by inserting the object into the one or more similar situations. The new simulation may be run in order to evaluate the software.

19 Claims, 8 Drawing Sheets

100

(56) References Cited

U.S. PATENT DOCUMENTS

| | | | |
|---|---|---|---|
| 11,814,059 B1 * | 11/2023 | Reschka | B60W 40/09 |
| 12,055,941 B1 * | 8/2024 | Crego | G05D 1/0214 |
| 2005/0187714 A1 | 8/2005 | Brulle-Drews | |
| 2006/0273884 A1 | 12/2006 | Watkins et al. | |
| 2007/0129087 A1 | 6/2007 | Bell | |
| 2009/0115621 A1 | 5/2009 | Nguyen et al. | |
| 2009/0215011 A1 | 8/2009 | Christensen et al. | |
| 2009/0285369 A1 | 11/2009 | Kandala | |
| 2010/0250111 A1 | 9/2010 | Gutierrez et al. | |
| 2014/0227991 A1 | 8/2014 | Breton et al. | |
| 2015/0073695 A1 | 3/2015 | Groves et al. | |
| 2015/0230061 A1 | 8/2015 | Srivastava | |
| 2015/0253144 A1 | 9/2015 | Rau et al. | |
| 2016/0071398 A1 | 3/2016 | Boss et al. | |
| 2016/0232137 A1 | 8/2016 | Liu | |
| 2016/0284038 A1 | 9/2016 | Johnson | |
| 2016/0379310 A1 | 12/2016 | Madigan et al. | |
| 2017/0219356 A1 | 8/2017 | Murayama et al. | |
| 2017/0286570 A1 * | 10/2017 | Kim | G06F 11/3688 |
| 2017/0293950 A1 | 10/2017 | Rathod | |
| 2017/0328732 A1 | 11/2017 | Vandanapu | |
| 2018/0060467 A1 * | 3/2018 | Schulte | B60W 30/0956 |
| 2018/0143033 A1 | 5/2018 | Hu | |
| 2018/0176749 A1 | 6/2018 | Hussaini | |
| 2018/0267538 A1 | 9/2018 | Shum et al. | |
| 2018/0341571 A1 * | 11/2018 | Kislovskiy | G06F 11/0739 |
| 2018/0342035 A1 | 11/2018 | Sweeney et al. | |
| 2019/0129831 A1 | 5/2019 | Goldberg | |
| 2019/0130056 A1 | 5/2019 | Tascione et al. | |
| 2019/0179738 A1 | 6/2019 | Hawthorne et al. | |
| 2019/0190790 A1 | 6/2019 | Coolbaugh et al. | |
| 2019/0212754 A1 | 7/2019 | Smith | |
| 2019/0230467 A1 | 7/2019 | Williams et al. | |
| 2019/0271553 A1 | 9/2019 | Simpson | |
| 2020/0036413 A1 | 1/2020 | Deutsch et al. | |
| 2020/0053518 A1 | 2/2020 | Kang et al. | |
| 2020/0166356 A1 | 5/2020 | Beaurepaire et al. | |
| 2020/0171977 A1 | 6/2020 | Jales Costa et al. | |
| 2020/0225668 A1 | 7/2020 | Masuda et al. | |
| 2020/0233940 A1 | 7/2020 | Edwards | |
| 2020/0264940 A1 | 8/2020 | Guereca-Pinuelas et al. | |
| 2020/0282988 A1 | 9/2020 | Madrigal et al. | |
| 2020/0314772 A1 | 10/2020 | Roth-Mandutz et al. | |
| 2020/0396292 A1 | 12/2020 | Ono | |
| 2021/0012656 A1 | 1/2021 | Davis | |
| 2021/0063184 A1 | 3/2021 | Heinisch et al. | |
| 2021/0103958 A1 | 4/2021 | Ippitsu | |
| 2021/0136572 A1 | 5/2021 | Ingraham et al. | |
| 2021/0157882 A1 | 5/2021 | Liu et al. | |
| 2021/0166474 A1 * | 6/2021 | Behar | G06T 19/20 |
| 2021/0302960 A1 | 9/2021 | Mcgill et al. | |
| 2021/0314305 A1 | 10/2021 | Rodriguez | |
| 2021/0347372 A1 | 11/2021 | Bagschik et al. | |
| 2021/0394787 A1 * | 12/2021 | Xiao | B60W 60/0027 |
| 2021/0404823 A1 | 12/2021 | Kisser et al. | |
| 2022/0005291 A1 * | 1/2022 | Konrardy | B60W 60/0015 |

* cited by examiner

110 Computing Device(s)

120 Processor(s)

130 Memory

132 Instructions

134 Data

150 User Inputs

152 Displays

154 Speakers

156 Wireless Network Connection(s)

160 Deceleration System

162 Acceleration System

164 Steering System

166 Signaling System

168 Planning System

170 Routing System

172 Positioning System

174 Perception System

176 Behavior Modeling System

178 Power System (Engine)

100

400

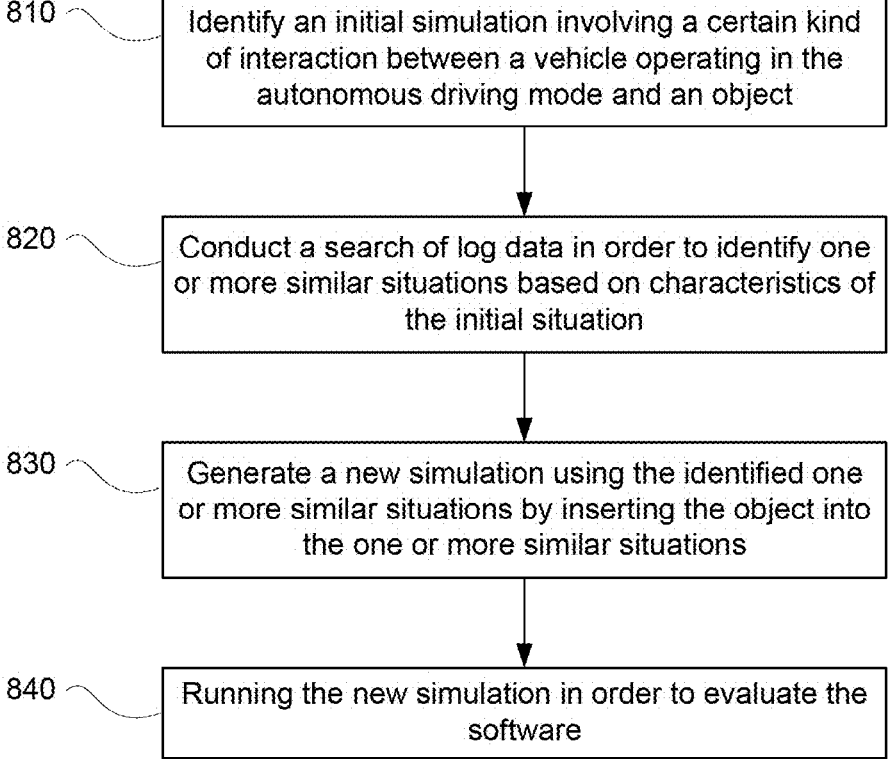

810   Identify an initial simulation involving a certain kind of interaction between a vehicle operating in the autonomous driving mode and an object 820   Conduct a search of log data in order to identify one or more similar situations based on characteristics of the initial situation 830   Generate a new simulation using the identified one or more similar situations by inserting the object into the one or more similar situations 840   Running the new simulation in order to evaluate the software

REALISM IN LOG-BASED SIMULATIONS

CROSS REFERENCE TO RELATED APPLICATIONS

The present application is a continuation of U.S. patent application Ser. No. 17/104,016, filed Nov. 25, 2020, the entire disclosure of which is incorporated herein by reference.

BACKGROUND

Autonomous vehicles, such as vehicles which do not require a human driver when operating in an autonomous driving mode, may be used to aid in the transport of passengers or items from one location to another. An important component of an autonomous vehicle is the perception system, which allows the vehicle to perceive and interpret its surroundings using sensors such as cameras, radar, LIDAR sensors, and other similar devices. For instance, the perception system and/or the vehicle's computing devices may process data from these sensors in order to identify objects as well as their characteristics such as location, shape, size, orientation, heading, acceleration or deceleration, type, etc. This information is critical to allowing the vehicle's computing systems to make appropriate driving decisions for the vehicle.

BRIEF DESCRIPTION OF THE DRAWINGS

FIG. 8 is a flow diagram in accordance with aspects of the disclosure.

SUMMARY

Figure 1:
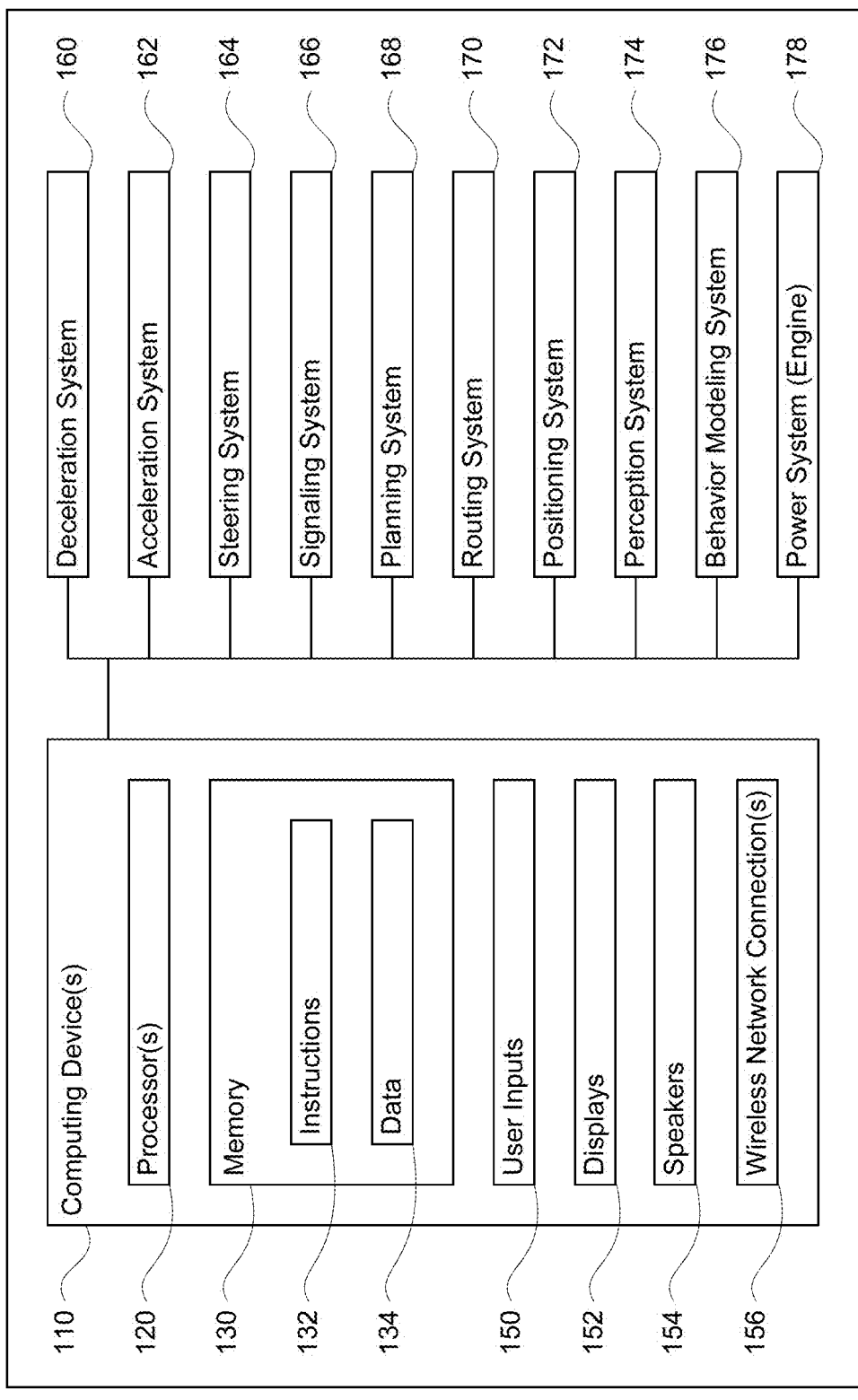
FIG. 1 is a functional diagram of an example vehicle in accordance with aspects of the disclosure.

Aspects of the disclosure provide a method of generating simulations in order to evaluate software used to control autonomous vehicles in an autonomous driving mode. The method includes identifying, by one or more processors, an initial situation involving a certain kind of interaction between a vehicle operating in the autonomous driving mode and an object;

conducting, by the one or more processors, a search of log data in order to identify one or more similar situations based on characteristics of the initial situation; generating, by the one or more processors, a new simulation using the identified one or more similar situations by inserting the object into the one or more similar situations; and running, by the one or more processors, the new simulation in order to evaluate the software.

In one example, the initial situation is identified from log data as including an actual collision between the vehicle and the object. In another example, the initial situation is identified from log data as including a near collision between the vehicle and the object. In another example, the initial situation is identified from log data as including a human operator taking control of the vehicle to avoid a potential collision with the object occurring. In another example, the initial situation is identified from a situation generated by a human operator including a collision or near collision between the vehicle and another object. In another example, conducting the search includes identifying a set of constraints and wherein the one or more similar situations include characteristics that meet ones of the set of constraints. In this example, the set of constraints includes a lane width. In addition or alternatively, the set of constraints includes a number of lanes. In another example, the set of constraints includes a speed of the vehicle operating in the autonomous driving mode. In another example, the set of constraints includes a trajectory of the vehicle operating in the autonomous driving mode.

In another example, the initial situation includes the vehicle operating in the autonomous driving mode merging. In another example, the initial situation includes the vehicle operating in the autonomous driving mode making a turn in front of a bicyclist. In another example, the initial situation includes the vehicle operating in the autonomous driving mode making an unprotected turn. In another example, the initial situation includes the object cutting in with the vehicle operating in the autonomous driving mode. In another example, generating the new simulation includes using a neutral frame of reference for the new simulation. In this example, the neutral frame of reference includes a location of a simulated vehicle for the new simulation relative to a lane. In addition or alternatively, generating the new simulation includes converting characteristics of the object in the initial situation to the neutral frame of reference. In another example, generating the new simulation includes inserting the object into the one or more similar situations and interpolating backwards towards a beginning of the new simulation using characteristics of the object from the initial situation. In another example, generating the new simulation includes having the object follow a same trajectory in the new simulation as in the initial situation. In another example, generating the new simulation includes adjusting a characteristic of the object in the new simulation based on a characteristic of a vehicle in the one or more similar situations.

DETAILED DESCRIPTION

Overview

The technology relates to evaluating software used to control vehicles in an autonomous driving mode using simulations. In some instances, the simulations may be log-based simulations which are run using log data collected by a vehicle over some brief period of time such as 1 minute or more or less. The log data may include information from the vehicle's various systems. At the same time, the actual vehicle is replaced with a virtual or simulated autonomous vehicle which can make decisions using software for controlling the vehicle autonomously. Alternatively, the "log data" may be simulated, that is may be created by a human operator as opposed to being generated from a real vehicle driving in the world. By using simulations, the software can be rigorously evaluated. For instance, the simulations may be used to determine whether a particular type of event has occurred, such as a particular type of behavior or collision. As an example, these events may be used for various purposes, such as determining whether the software can "pass" a given simulation without a collision without requiring a vehicle to physically drive "real" miles or having to "manufacture" situations in the real world.

There may be particular situations in which a human operator is interested in evaluating the autonomous vehicle control software. However, there may only be that one instance or only a few instances of such situations available to run simulations. In order to improve the usefulness of these simulations, certain types of situations, such as collisions or potential collisions, may be automatically translated into other situations and used to generate new simulations.

Different sources may be used to identify certain types of situations as an initial situation. The first may include the aforementioned log data. These may include situations which resulted in an actual collision between a vehicle and another object, situations which resulted in a near collision between a vehicle and another object, and situations where a safety driver took control of the vehicle to avoid a potential collision, but where if this had not occurred, the situation would have resulted in a collision or near collision. Alternatively, rather than coming from the log data, these certain types of situations may be generated "manually" using log data or other data and creating a collision or near collision between an autonomous vehicle and another agent or object. In such instances, the human operator may give the object certain characteristics at the time of the collision or near collision.

The initial situation may then be used to identify one or more similar situations. This may involve conducting a search over the log data to identify log data with similar geometry, and characteristics of the vehicle that collected the log data. Alternatively, a similar search may be conducted using other simulated data.

In order to find one or more similar situations, the search may involve looking for similar constraints. Such constraints may include physical characteristics of the geographic area from the initial situation. The searching may involve iteratively looking through log data and comparing the characteristics of the log data or other data to the constraints.

The object with which the vehicle collided or had a near collision in the initial situation may then be "inserted" into the other similar situations in order to generate a new simulation. To do so, the vehicle's location in the world relative to the roadgraph may be used to determine where to place the object in the new simulation. In addition, a similar time of collision between the initial situation and the new simulation may be used as a point of reference, and the system may interpolate backwards towards the beginning of the new simulation using the characteristics of the object in the initial situation. In this regard, the object would follow the same trajectory in the new simulation as in the initial situation.

The new simulations may then be run in order to evaluate the software and determine whether the new simulations would result in a collision or near collision with different versions of the software. This may be used to identify bugs or other issues with the software and direct efforts to improve the software.

The features described herein may provide for a wider variety of simulations when evaluating software for controlling vehicles in an autonomous driving mode. The new simulations described herein may be generated on a much larger scale than those that are generated manually by human operators. For instance, without such features, human operators would need to create software code or develop algorithms that can interpret the scene to understand what's going on in a certain situation which can require a lot of iterations to achieve realistic simulations. This may be time-consuming and therefore costly in terms of resources. Moreover, an object and its behavior can be replicated to all of the one or more similar situations identified in the log data. This may allow the system to automatically generate realistic simulations with very little involvement by human operators making the process very scalable. In addition, given the nature of these new simulations and the increased number of simulations available for evaluating, the system may be more readily able to identify high-severity bugs in the software or other issues relating to how the vehicle responds to other road users (e.g. reckless drivers, etc.) using the new simulations.

Example Systems

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, etc. The vehicle may have one or more computing devices, such as computing device 110 containing one or more processors 120, memory 130 and other components typically present in general purpose computing devices.

The memory 130 stores information accessible by the one or more processors 120, including instructions 132 and data 134 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 132 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 134 may be retrieved, stored or modified by processor 120 in accordance with the instructions 132. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processor 120 may be any conventional processors, such as commercially available CPUs or GPUs. Alternatively, the one or more processors may be a dedicated device such as an ASIC or other hardware-based processor. Although FIG. 1 functionally illustrates the processor, memory, and other elements of computing device 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing device 110. Accordingly, references to a processor or computing device will be understood to include references to a collection of processors or computing devices or memories that may or may not operate in parallel.

Computing devices 110 may include all of the components normally used in connection with a computing device such as the processor and memory described above as well as one or more user inputs 150 (e.g., one or more button, mouse, keyboard, touch screen and/or microphone), various electronic displays (e.g., a monitor having a screen or any other electrical device that is operable to display information), and one or more speakers 154 to provide information to a passenger of the vehicle 100 or others as needed. For example, one or more displays 152 may be located within a cabin of vehicle 100 and may be used by computing devices 110 to provide information to passengers within the vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

The computing devices 110 may be part of an autonomous control system for the vehicle 100 and may be capable of communicating with various components of the vehicle in order to control the vehicle in an autonomous driving mode. For example, returning to FIG. 1, the computing devices 110 may be in communication with various systems of vehicle 100, such as deceleration system 160, acceleration system 162, steering system 164, signaling system 166, planning system 168, routing system 170, positioning system 172, perception system 174, behavior modeling system 176, and power system 178 in order to control the movement, speed, etc. of vehicle 100 in accordance with the instructions 134 of memory 130 in the autonomous driving mode.

As an example, the computing devices 110 may interact with deceleration system 160 and acceleration system 162 in order to control the speed of the vehicle. Similarly, steering system 164 may be used by computing devices 110 in order to control the direction of vehicle 100. For example, if vehicle 100 is configured for use on a road, such as a car or truck, the steering system may include components to control the angle of wheels to turn the vehicle. The computing devices 110 may also use the signaling system 166 in order to signal the vehicle's intent to other drivers or vehicles, for example, by lighting turn signals or brake lights when needed.

Routing system 170 may be used by the computing devices 110 in order to generate a route to a destination using map information. Planning system 168 may be used by computing device 110 in order to generate short-term trajectories that allow the vehicle to follow routes generated by the routing system. In this regard, a trajectory may include the speeds and geometry of the path or pathway being followed by the vehicle 100 or a set of positions, orientations or poses, speeds, accelerations, etc. at different points in time. The planning system 168 and/or routing system 166 may store detailed map information, e.g., highly detailed maps identifying a road network including the shape and elevation of roadways, lane lines, intersections, crosswalks, speed limits, traffic signals, buildings, signs, real time traffic information, pullover spots, vegetation, or other such objects and information.

In addition to the aforementioned physical feature information, the map information may include a plurality of graph nodes and edges representing road or lane segments that together make up the road network of the map information. Each edge is defined by a starting graph node having a specific geographic location (e.g. latitude, longitude, altitude, etc.), an ending graph node having a specific geographic location (e.g. latitude, longitude, altitude, etc.), and a direction. This direction may refer to a direction the vehicle 100 must be moving in in order to follow the edge (i.e. a direction of traffic flow). The graph nodes may be located at fixed or variable distances. For instance, the spacing of the graph nodes may range from a few centimeters to a few meters and may correspond to the speed limit of a road on which the graph node is located. In this regard, greater speeds may correspond to greater distances between graph nodes. The edges may represent driving along the same lane or changing lanes. Each node and edge may have a unique identifier, such as a latitude and longitude location of the node or starting and ending locations or nodes of an edge. In addition to nodes and edges, the map may identify additional information such as types of maneuvers required at different edges as well as which lanes are drivable.

The routing system 166 may use the aforementioned map information to determine a route from a current location (e.g. a location of a current node) to a destination. Routes may be generated using a cost-based analysis which attempts to select a route to the destination with the lowest cost. Costs may be assessed in any number of ways such as time to the destination, distance traveled (each edge may be associated with a cost to traverse that edge), types of maneuvers required, convenience to passengers or the vehicle, etc. Each route may include a list of a plurality of nodes and edges which the vehicle can use to reach the destination. Routes may be recomputed periodically as the vehicle travels to the destination.

The map information used for routing may be the same or a different map as that used for planning trajectories. For example, the map information used for planning routes not only requires information on individual lanes, but also the nature of lane boundaries (e.g., solid white, dash white, solid yellow, etc.) to determine where lane changes are allowed. However, unlike the map used for planning trajectories, the map information used for routing need not include other details such as the locations of crosswalks, traffic lights, stop signs, etc., though some of this information may be useful for routing purposes. For example, between a route with a large number of intersections with traffic controls (such as stop signs or traffic signal lights) versus one with no or very few traffic controls, the latter route may have a lower cost (e.g. because it is faster) and therefore be preferable.

Positioning system 170 may be used by computing devices 110 in order to determine the vehicle's relative or absolute position on a map or on the earth. For example, the positioning system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude, a location of a node or edge of the roadgraph as well as relative location information, such as location relative to other cars immediately around it which can often be determined with less noise that absolute geographical location.

The positioning system 172 may also include other devices in communication with the computing devices computing devices 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing device 110, other computing devices and combinations of the foregoing.

The perception system 174 also includes one or more components for detecting objects external to the vehicle such as other vehicles, obstacles in the roadway, traffic signals, signs, trees, etc. For example, the perception system 174 may include lasers, sonar, radar, cameras and/or any other detection devices that record data which may be processed by the computing devices of the computing devices 110. In the case where the vehicle is a passenger vehicle such as a minivan, the minivan may include a laser or other sensors mounted on the roof or other convenient location.

Figure 2:
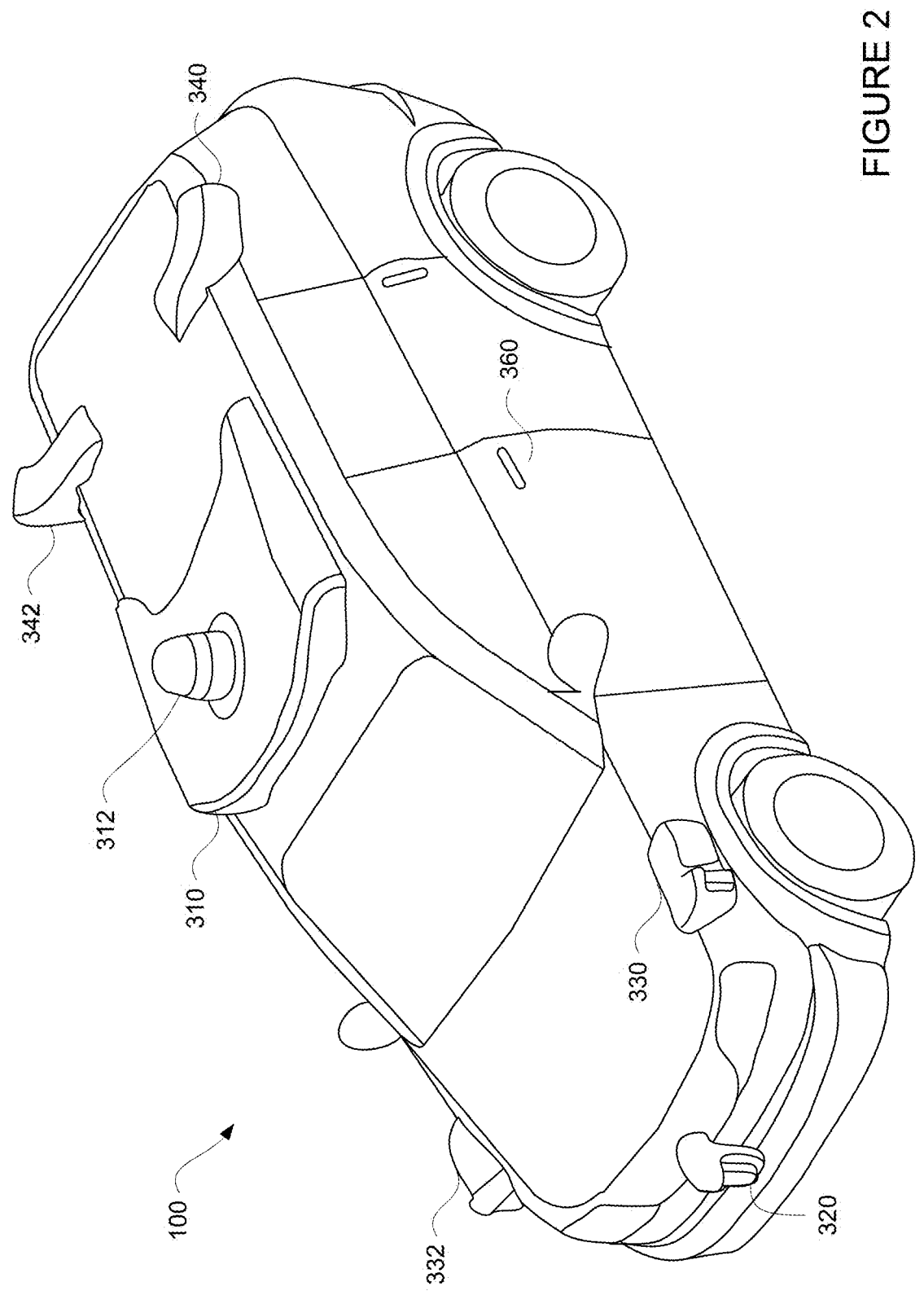
FIG. 2 is an example diagram of a vehicle in accordance with aspects of the disclosure.

For instance, FIG. 2 is an example external view of vehicle 100. In this example, roof-top housing 210 and dome housing 212 may include a LIDAR sensor as well as various cameras and radar units. In addition, housing 220 located at the front end of vehicle 100 and housings 230, 232 on the driver's and passenger's sides of the vehicle may each store a LIDAR sensor. For example, housing 230 is located in front of driver door 260. Vehicle 100 also includes housings 240, 242 for radar units and/or cameras also located on the roof of vehicle 100. Additional radar units and cameras (not shown) may be located at the front and rear ends of vehicle 100 and/or on other positions along the roof or roof-top housing 210.

The computing devices 110 may be capable of communicating with various components of the vehicle in order to control the movement of vehicle 100 according to primary vehicle control code of memory of the computing devices 110. For example, returning to FIG. 1, the computing devices 110 may include various computing devices in communication with various systems of vehicle 100, such as deceleration system 160, acceleration system 162, steering system 164, signaling system 166, planning system 168, routing system 170, positioning system 172, perception system 174, behavior modeling system 176, and power system 178 (i.e. the vehicle's engine or motor) in order to control the movement, speed, etc. of vehicle 100 in accordance with the instructions 134 of memory 130.

The various systems of the vehicle may function using autonomous vehicle control software in order to determine how to and to control the vehicle. As an example, a perception system software module of the perception system 174 may use sensor data generated by one or more sensors of an autonomous vehicle, such as cameras, LIDAR sensors, radar units, sonar units, etc., to detect and identify objects and their characteristics. These characteristics may include location, type, heading, orientation, speed, acceleration, change in acceleration, size, shape, etc. In some instances, characteristics may be input into a behavior prediction system software module of the behavior modeling system 176 which uses various behavior models based on object type to output a predicted future behavior for a detected object. In other instances, the characteristics may be put into one or more detection system software modules, such as a traffic light detection system software module configured to detect the states of known traffic signals, construction zone detection system software module configured to detect construction zones from sensor data generated by the one or more sensors of the vehicle as well as an emergency vehicle detection system configured to detect emergency vehicles from sensor data generated by sensors of the vehicle. Each of these detection system software modules may use various models to output a likelihood of a construction zone or an object being an emergency vehicle. Detected objects, predicted future behaviors, various likelihoods from detection system software modules, the map information identifying the vehicle's environment, position information from the positioning system 170 identifying the location and orientation of the vehicle, a destination location or node for the vehicle as well as feedback from various other systems of the vehicle may be input into a planning system software module of the planning system 168. The planning system 168 may use this input to generate trajectories for the vehicle to follow for some brief period of time into the future based on a route generated by a routing module of the routing system 170. In this regard, the trajectories may define the specific characteristics of acceleration, deceleration, speed, etc. to allow the vehicle to follow the route towards reaching a destination. A control system software module of the computing devices 110 may be configured to control movement of the vehicle, for instance by controlling braking, acceleration and steering of the vehicle, in order to follow a trajectory.

The computing devices 110 may control the vehicle in an autonomous driving mode by controlling various components. For instance, by way of example, the computing devices 110 may navigate the vehicle to a destination location completely autonomously using data from the detailed map information and planning system 168. The computing devices 110 may use the positioning system 170 to determine the vehicle's location and perception system 174 to detect and respond to objects when needed to reach the location safely. Again, in order to do so, computing device 110 and/or planning system 168 may generate trajectories and cause the vehicle to follow these trajectories, for instance, by causing the vehicle to accelerate (e.g., by supplying fuel or other energy to the engine or power system 178 by acceleration system 162), decelerate (e.g., by decreasing the fuel supplied to the engine or power system 178, changing gears, and/or by applying brakes by deceleration system 160), change direction (e.g., by turning the front or rear wheels of vehicle 100 by steering system 164), and signal such changes (e.g., by lighting turn signals) using the signaling system 166. Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

The computing devices 110 may control the vehicle in an autonomous driving mode by controlling various components. For instance, by way of example, the computing devices 110 may navigate the vehicle to a destination location completely autonomously using data from the detailed map information and planning system 168. The computing devices 110 may use the positioning system 170 to determine the vehicle's location and perception system 172 to detect and respond to objects when needed to reach the location safely. Again, in order to do so, computing device 110 may generate trajectories and cause the vehicle to follow these trajectories, for instance, by causing the vehicle to accelerate (e.g., by supplying fuel or other energy to the engine or power system 174 by acceleration system 162), decelerate (e.g., by decreasing the fuel supplied to the engine or power system 174, changing gears, and/or by applying brakes by deceleration system 160), change direction (e.g., by turning the front or rear wheels of vehicle 100 by steering system 164), and signal such changes (e.g. by using turn signals). Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Figure 3:
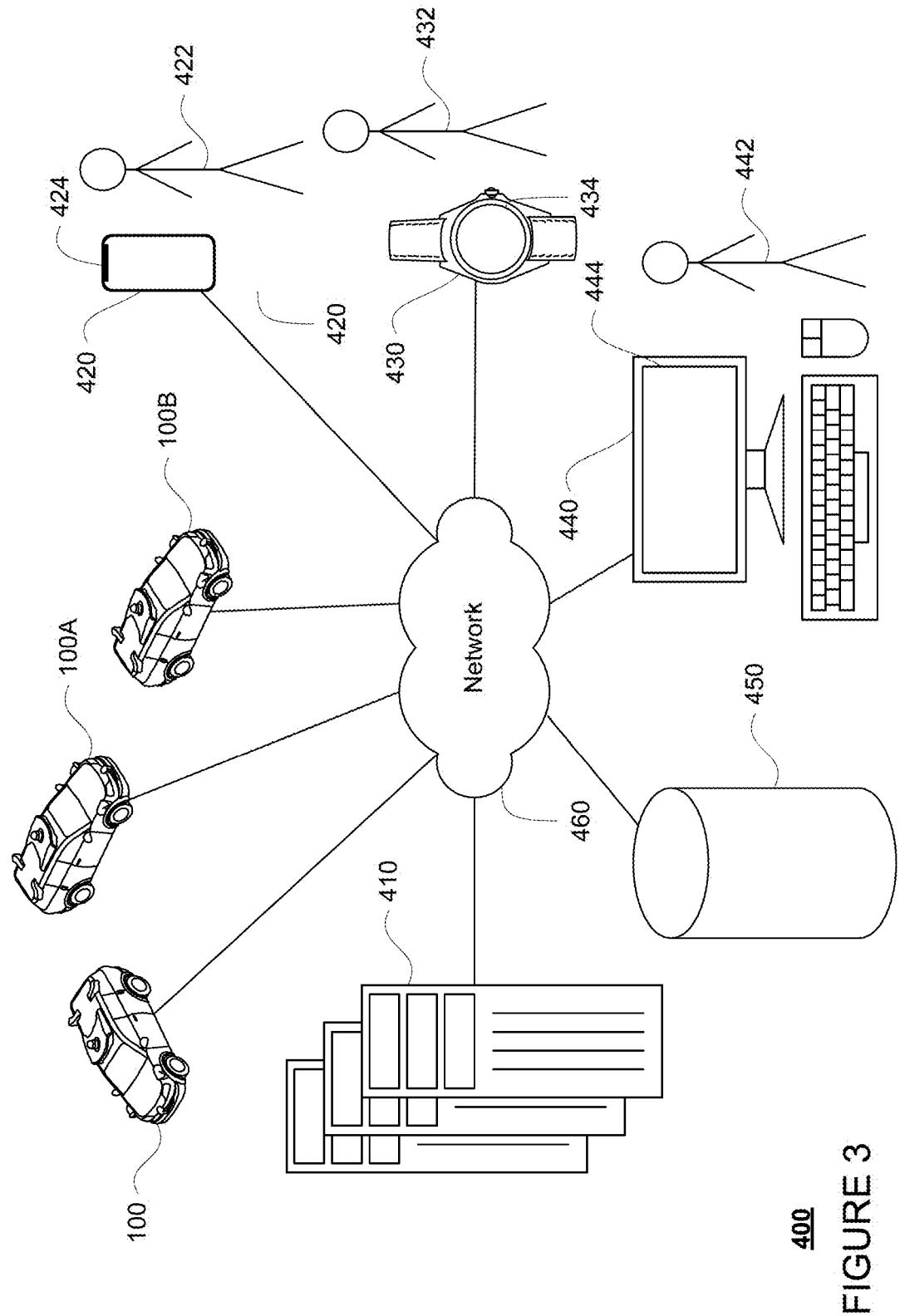
FIG. 3 is an example pictorial diagram of a system in accordance with aspects of the disclosure.
Figure 4:
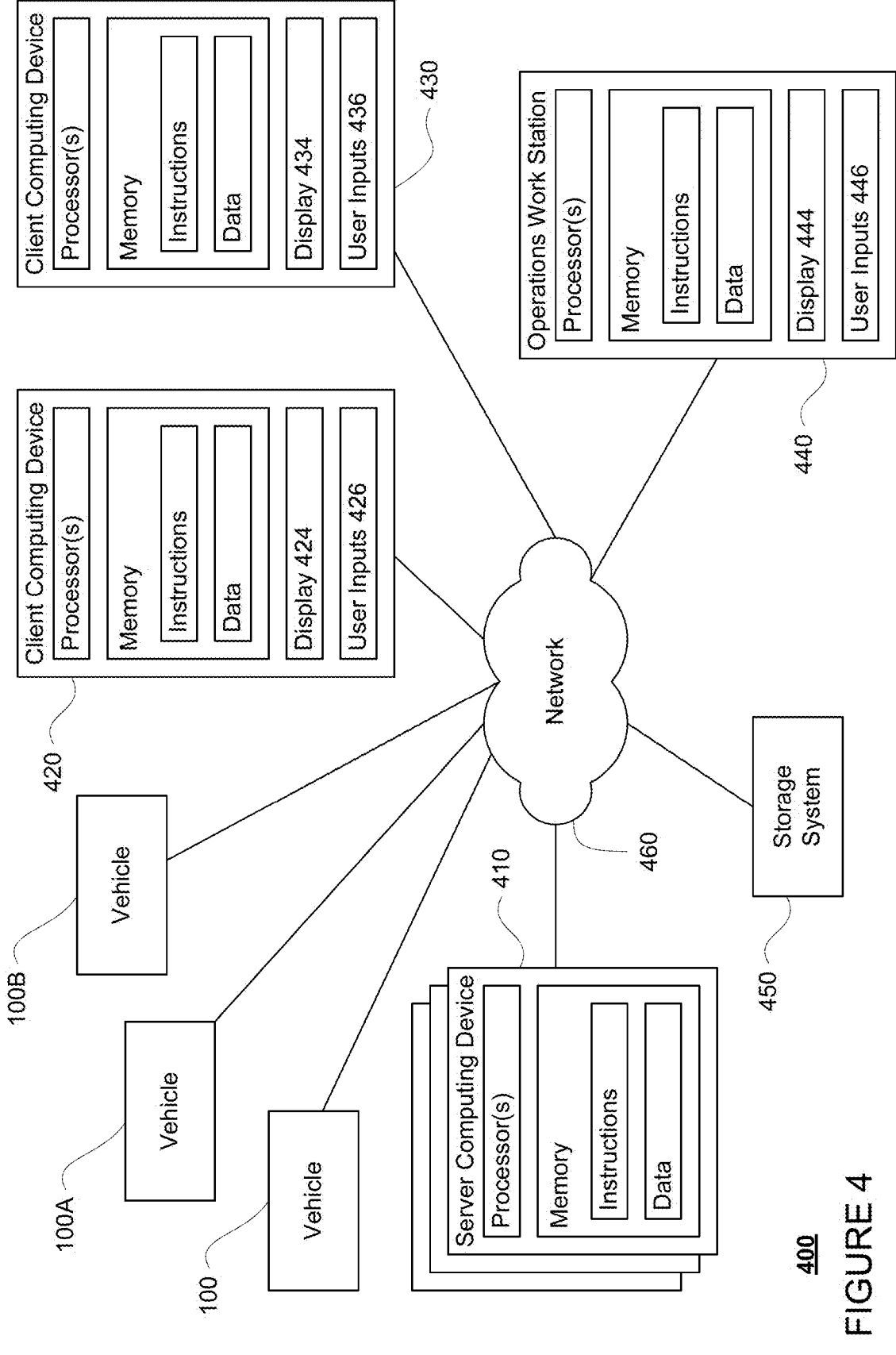
FIG. 4 is an example functional diagram of a system in accordance with aspects of the disclosure.

Computing device 110 of vehicle 100 may also receive or transfer information to and from other computing devices, such as those computing devices that are a part of the transportation service as well as other computing devices. FIGS. 3 and 4 are pictorial and functional diagrams, respectively, of an example system 400 that includes a plurality of computing devices 410, 420, 430, 440 and a storage system 450 connected via a network 460. System 400 also includes vehicle 100, and vehicles 100A, 100B which may be configured the same as or similarly to vehicle 100. Although only a few vehicles and computing devices are depicted for simplicity, a typical system may include significantly more.

As shown in FIG. 3, each of computing devices 410, 420, 430, 440 may include one or more processors, memory, instructions and data. Such processors, memories, data and instructions may be configured similarly to one or more processors 120, memory 130, instructions 132 and data 134 of computing device 110.

The network 460, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 410 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 110 of vehicle 100 or a similar computing device of vehicle 100A as well as computing devices 420, 430, 440 via the network 460. For example, vehicles 100, 100A, may be a part of a fleet of vehicles that can be dispatched by server computing devices to various locations. In this regard, the server computing devices 410 may function as a validation computing system which can be used to validate autonomous control software which vehicles such as vehicle 100 and vehicle 100A may use to operate in an autonomous driving mode. In addition, server computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

As shown in FIG. 3, each client computing device 420, 430, 440 may be a personal computing device intended for use by a user 422, 432, 442, and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touchscreen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430, and 440 may each comprise a full-sized personal computing device, they may alternatively comprise client computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, depicted as a smart watch as shown in FIG. 3. As an example the user may input information using a small keyboard, a keypad, microphone, using visual signals with a camera, or a touch screen.

In some examples, client computing device 420 may be a mobile phone used by passenger of a vehicle. In other words, user 422 may represent a passenger. In addition, client computing device 430 may represent a smart watch for a passenger of a vehicle. In other words, user 432 may represent a passenger. The client computing device 430 may represent a workstation for an operations person, for example, a human operator or someone who may work to change, update, and/or evaluate autonomous vehicle control software. In other words, user 442 may represent an engineer or other technician. Although only a few passengers and human operators are shown in FIGS. 3 and 4, any number of such, passengers and human operators (as well as their respective client computing devices) may be included in a typical system.

As with memory 130, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 4 and 5, and/or may be directly connected to or incorporated into any of the computing devices 110, 410, 420, 430, 440, etc.

Storage system 450 may store various types of information as described in more detail below. This information may be retrieved or otherwise accessed by a server computing device, such as one or more server computing devices 410, in order to perform some or all of the features described herein. For instance, storage system 450 may store log data. This log data may include data generated by the various systems of a vehicle, such as vehicle 100, while the vehicle is being operated in a manual driving mode or an autonomous driving mode. For instance, the log data may include sensor data generated by a perception system, such as perception system 172 of vehicle 100. As an example, the sensor data may include raw sensor data as well as data identifying defining characteristics of perceived objects such as shape, location, orientation, speed, etc. of objects such as vehicles, pedestrians, bicyclists, vegetation, curbs, lane lines, sidewalks, crosswalks, buildings, etc. The log data may also include "event" data identifying different types of events such as collisions or near collisions with other objects, planned trajectories describing a planned geometry and/or speed for a potential path of the vehicle, actual locations of the vehicles at different times, actual orientations/headings of the vehicle at different times, actual speeds, accelerations and decelerations of the vehicle at different times, classifications of and responses to perceived objects, behavior predictions of perceived objects, status of various systems (such as acceleration, deceleration, perception, steering, signaling, routing, planning, power, etc.) of the vehicle at different times including logged errors, inputs to and outputs of the various systems of the vehicle at different times, etc. As such, these events and the sensor data may be used to "recreate" the vehicle's environment, including perceived objects, and behavior of a vehicle in a simulation. In some instances, the log data may be annotated with information identifying behaviors of the autonomous vehicle, such as passing, changing lanes, merging, etc., as well as with information identifying behaviors of other agents or objects in the log data, such as passing or overtaking the autonomous vehicle, changing lanes, merging, etc. In addition, some of the log data may be simulated log data as discussed further below.

In addition, the storage system 450 may also store autonomous control software which is to be used by vehicles, such as vehicle 100, to operate a vehicle in an autonomous driving mode. This autonomous control software stored in the storage system 450 may be a version which has not yet been evaluated or validated. Once validated, the autonomous control software may be sent, for instance, to memory 130 of vehicle 100 in order to be used by computing devices 110 to control vehicle 100 in an autonomous driving mode.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

FIG. 8 includes an example flow diagram 800, for generating simulations in order to evaluate software used to control vehicles in an autonomous driving mode, which may be performed by one or more processors such as processors of server computing devices 410. For instance, at block 810, an initial situation involving a certain kind of interaction between a vehicle operating in the autonomous driving mode and an object is identified.

As noted above, there may be particular situations in which a human operator is interested in evaluating particular aspects of the autonomous vehicle control software. However, there may only be that one instance or only a few instances of the particular situation available to run simulations. In that regard, there may be only a small number of situations that can be used to run and evaluate the particular aspect of the autonomous vehicle control software.

In order to improve the usefulness of these simulations, certain types of situations, such as collisions or potential collisions, may be automatically translated into other situations and used to generate new simulations. In this regard, the number of available situations for evaluating the particular aspect of the autonomous vehicle control software may be increased greatly. For instance, there may be an initial situation when a vehicle turns right in front of a bicyclist. That situation may be used to find other similar situations where a vehicle turns right and those other similar situations may be used to generate new simulations with similar characteristics as the initial situation. As another instance, if there is a collision or near collision at a merge, that initial situation may be used to find other similar situations where a vehicle merges, and those other similar situations may be used to generate new simulations with similar characteristics as the initial situation.

Different sources may be used to identify certain types of situations as an initial situation. The first may include searching the aforementioned log data to try and find certain types of situations. For instance, all or some of the log data may be tagged, flagged or otherwise labeled with information identifying the types of objects, locations, and whether any collisions or near collisions occurred (or were about to occur before a human operator took over). These tags may be used to identify specific log data that meets the human operator's criteria. These certain types of situations may include situations which resulted in an actual collision between a autonomous vehicle and another object (e.g. actual contact), situations which resulted in a near collision between a autonomous vehicle and another object (e.g. very close to one another), and situations where a safety driver (tasked with monitoring an autonomous vehicle) took control of the autonomous vehicle to avoid a potential collision, but where if this had not occurred, the situation would have resulted in a collision or near collision.

Typically, these situations may be few and far between and identifying them may be specific to the needs of the human operator and what features of the autonomous vehicle control software are to be tested. Thus, alternatively, rather than coming from the log data, these certain types of situations may be generated "artificially" or rather by a human operator using log data or other data and creating the aforementioned simulated log data for a simulated collision or near collision between an autonomous vehicle and another agent or object. In such instances, the human operator may give the object and the autonomous vehicle certain characteristics (e.g. location, heading, speed, acceleration/deceleration, etc.) at the time of the collision or near collision. Generating such simulated log data may be requirements driven, (e.g. "We know that cyclists might come up behind us while we turn, so we should test that") or more for the sake of analysis (e.g. an issue was observed in the past, so a human operator would want to create a variety of similar situations and see if any undesirable behavior comes from those similar situations.

Figure 5C:
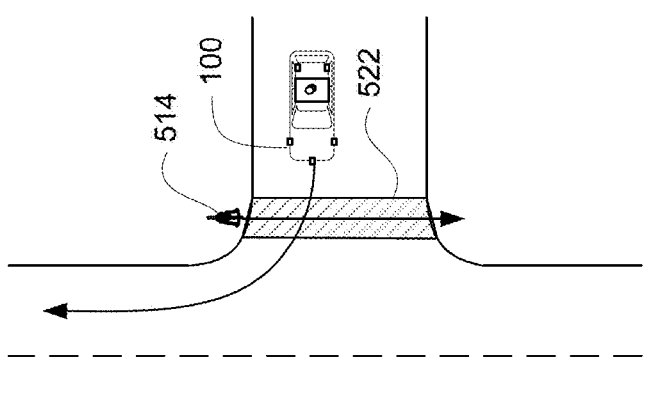
FIGS. 5A-5C are an example of an initial situation in accordance with aspects of the disclosure.
Figure 5B:
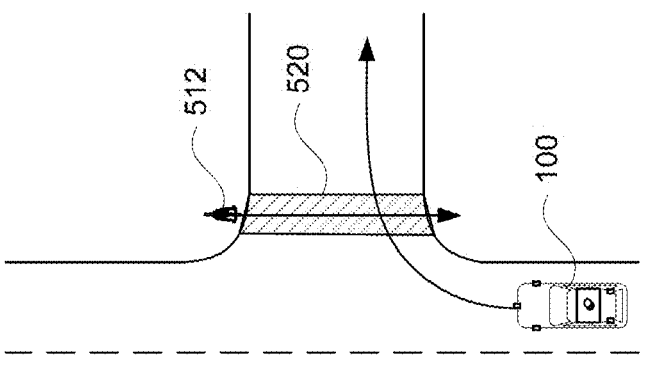
Figure 5A:
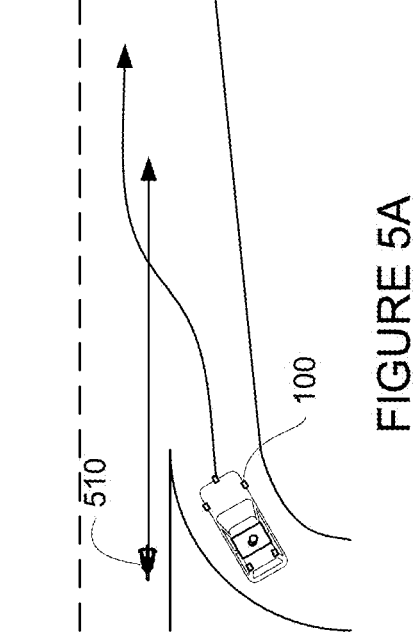

FIGS. 5A-C, 6A-C and 7A-C provide examples of different situations which may be identified or selected as an initial situation either by the server computing devices 410 and/or a human operator, such as human operator 442 as described above. FIG. 5A-5C includes examples of initial situations in which a trajectory of autonomous vehicle 100 intersects with a trajectory of bicyclists 510, 512, 514 (which alternatively could be pedestrians). In these examples, the arrows represent the trajectories of the autonomous vehicle 100 and bicyclists 510, 512, 514, respectively. Again trajectories may include the speeds and geometry of the path or pathway being followed by an object or a set of positions, orientations or poses, speeds, accelerations, etc. at different points in time. Turning to the example of FIG. 5A, autonomous vehicle 100 is merging into a lane of traffic in which the bicyclist 510 is riding. In the example of FIG. 5B, autonomous vehicle 100 is making a right turn onto a street including a crosswalk 520 which the bicyclist 512 is traversing. In the example of FIG. 5C, autonomous vehicle 100 is making a right turn from a street including a crosswalk 522 which the bicyclist 514 is traversing. Again, in each of these examples, a trajectory of autonomous vehicle 100 intersects with a trajectory of a bicyclist which could result in a collision or near collision. As such, these may be initial situations selected by a human operator and/or identified by the server computing devices 410.

Figures 6A, 6B, 6C:
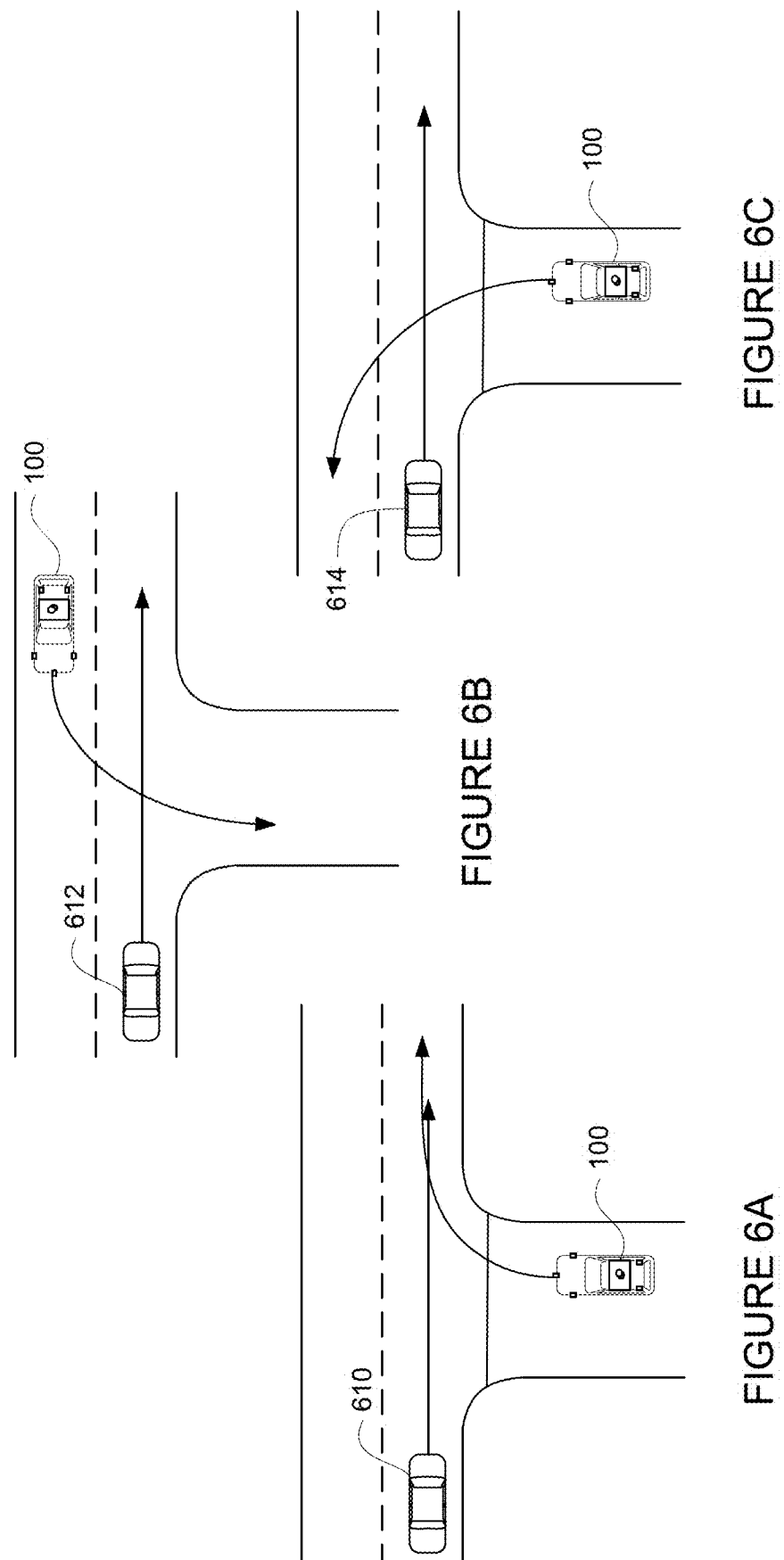
FIGS. 6A-6C are an example of an initial situation in accordance with aspects of the disclosure.

FIG. 6A-6C includes examples of initial situations in which a trajectory of autonomous vehicle 100 intersects with a trajectory of another vehicle 610, 612, 614 while making an unprotected turn, or rather a turn where other traffic has the right of way or when the turn is being made there is no traffic light or other traffic control device (e.g. a stop sign) controlling the other traffic. In these examples, the arrows represent the trajectories of the autonomous vehicle 100 and vehicle 610, 612, 614, respectively. Turning to the example of FIG. 6A, autonomous vehicle 100 is making an unprotected right turn into a lane of traffic in which the vehicle 610 is traveling. In the example of 6B, autonomous vehicle 100 is making an unprotected left turn across a lane of traffic in which the vehicle 612 is currently traveling. In the example of FIG. 6C, autonomous vehicle 100 is also making an unprotected left turn across a lane of traffic in which the vehicle 612 is currently traveling. Again, in each of these examples, a trajectory of autonomous vehicle 100 intersects with a trajectory of another vehicle which could result in a collision or near collision. As such, these may be initial situations selected by a human operator and/or identified by the server computing devices 410.

Figures 7A, 7B, 7C:
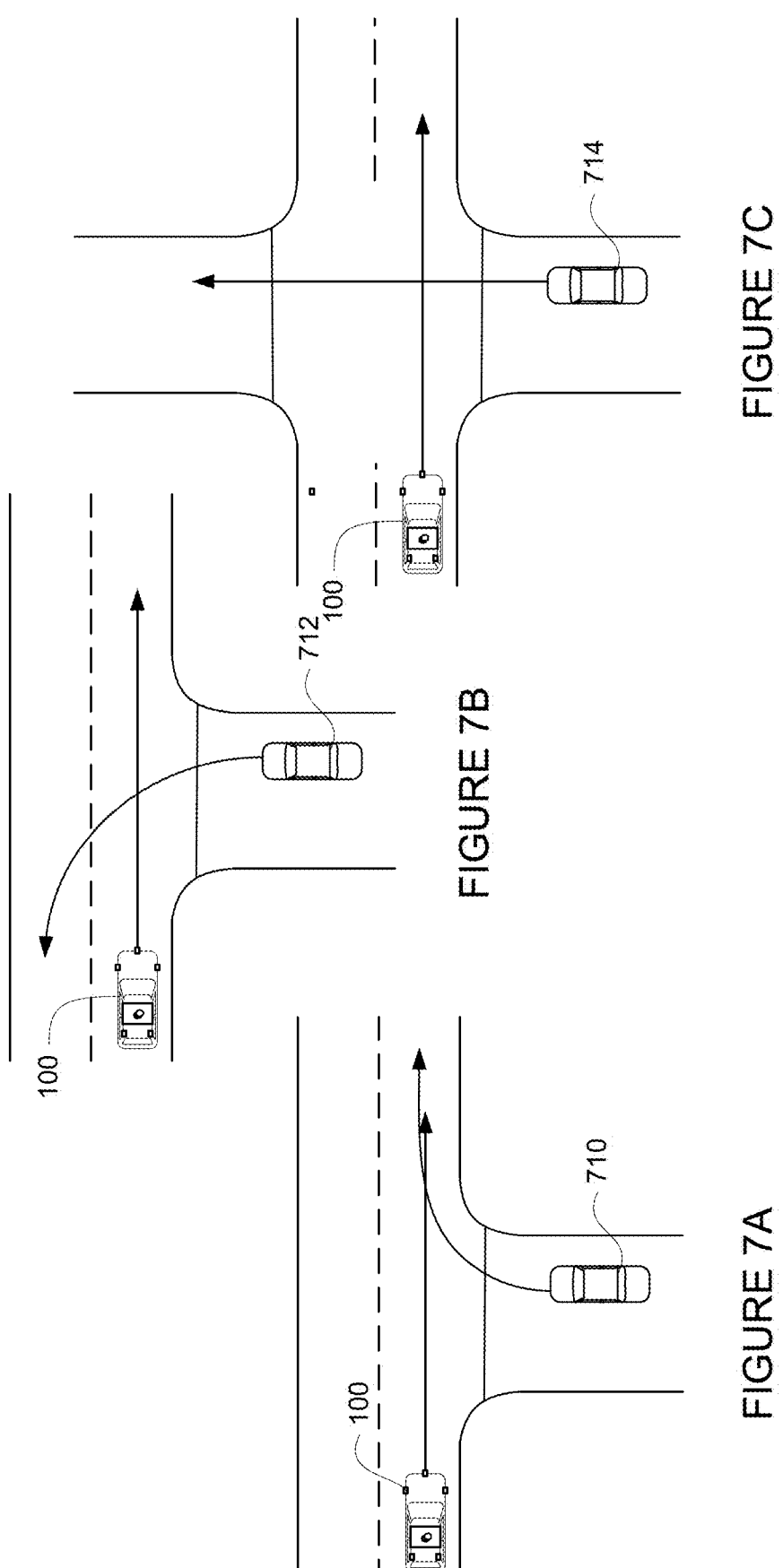
FIGS. 7A-7C are an example of an initial situation in accordance with aspects of the disclosure.

FIG. 7A-7C includes examples of initial situations in which a trajectory of autonomous vehicle 100 intersects with a trajectory of another vehicle 710, 712, 714 while the other vehicle "cuts-into" the lane of autonomous vehicle 100. In these examples, the arrows represent the trajectories of the autonomous vehicle 100 and vehicle 710, 712, 714, respectively. Turning to the example of FIG. 7A, vehicle 710 is making a left turn in front of autonomous vehicle 100 into the lane in which the autonomous vehicle 100 is currently traveling. In the example of 7B, vehicle 712 is making a left turn across a lane of traffic in which the autonomous vehicle 100 is currently traveling. In the example of FIG. 7C, vehicle 714 is crossing an intersection in front of the lane in which autonomous vehicle 100 is currently traveling. Again, in each of these examples, a trajectory of autonomous vehicle 100 intersects with a trajectory of another vehicle which could result in a collision or near collision. As such, these may be initial situations selected by a human operator and/or identified by the server computing devices 410.

Returning to FIG. 8, at block 820, a search of log data is conducted in order to identify one or more similar situations based on characteristics of the initial situation. The initial situation may be used by the server computing devices 410 to identify one or more similar situations essentially by pattern matching the geometry of the environment in the initial situation and the characteristics of the autonomous vehicle. This may involve the server computing devices 410 conducting a search over the log data to identify log data with similar geometry and characteristics of the autonomous vehicle (or the vehicle that collected the log data). Alternatively, a similar search may be conducted using the aforementioned simulated log data. For example, some simulations may be run that are not based on log data, but are instead based on machine-generated synthetic scenes. As such, this other simulated data may be sources for one or more similar situations. Searching for similar geometry may include pattern matching for (e.g. physical characteristics and dimensions of the vehicle's environment as opposed to other objects nearby. Searching for similar characteristics of the autonomous vehicle may include pattern matching for a similar speed, similar trajectory, and/or similar maneuvers, such as right turn, left turn, U-turn, k-turn, passing, merging, pulling over, etc. of the autonomous vehicle 100, 100A, 100B. Of course, the searching need not include searching for situations with similar agents (e.g. other road users such as pedestrians, bicyclists, vehicles, etc.) as with the initial situation. By doing so, the search does not become overly restrictive in the pattern matching and allows for significantly more results and thus, more similar situations for simulations as discussed further below.

In order to find one or more similar situations, the search may involve identifying a set of constraints for the initial situation and searching for characteristics that meet these constraints. An example set of constraints may include the physical geometry of the geographic area in which the first simulation occurs such as a similar lane width, similar number of lanes, similar lane curvature as well as constraints relating to the autonomous vehicle such as similar speed (at the time of the collision or near collision) and trajectory of the autonomous vehicle (leading up to the collision or near collision), etc. Another example constraint may be that there is physical space available to insert the object (e.g. no other objects from the log would be in the way) as discussed further below. Another example constraint may include similar traffic light state or other types of environmental factors. These constraints may be fixed values (e.g. 3 lanes of traffic in each direction) or ranges (e.g. lanes that are no more than 2 inches wider or narrower). For a trajectory, which may include both geometry (e.g. a path of connected locations) as well as speed components (in e.g. speeds, accelerations and/or decelerations, rates of acceleration and/or deceleration, etc.) these may be converted to constraints and used to search for similar situations.

The searching may involve iteratively looking through log data and comparing the characteristics of the log data or other data to the constraints to find similar situations. As one approach, a search may involve first looking for locations that are similar geographically in the map information and subsequently searching the log data for those locations. For example, if the initial situation involves a right turn at a four-way intersection, the searching might look only at right turn situations at a four-way intersection. Another approach could use machine learning or statistics. For example, the server computing devices 410 could develop a set of features and then perform a nearest neighbor search on the features to get the most similar situations there are. The degree of similarity between the characteristics of the initial situation and any similar situations may be hand tuned or otherwise set by human operators.

For example, if the initial situation includes a bicyclist crossing a merge as in the example of FIG. 5A, similar situations would involve those that include a merge and the autonomous vehicle that captured the log data or other simulation data being at the same relative location to a merge similar to the relative location of the autonomous vehicle to a merge in the initial situation. Other examples for bicyclists may include right turns with parallel crossing bicyclists and right turns with perpendicular crossing bicyclists as in the examples of FIGS. 5B and 5C. In such examples, similar situations would involve those that include a right turn and an autonomous vehicle being at the same relative location to a turn having similar geometry as the turn in the initial situation. Of course, the searching would not include searching for similar situations with bicyclists having the same or similar characteristics as the bicyclists in the initial situation.

Returning to FIG. 8, at block 830, a new simulation is generated using the identified one or more similar situations by inserting the object into the one or more similar situations. The object with which the autonomous vehicle collided or had a near collision in the initial situation may then be "inserted" into the other similar situations in order to generate a new simulation. To do so, the autonomous vehicle's location in the world relative to the roadgraph may be used to determine where to place the object in the new simulation. To simplify this placement, a neutral frame of reference may be used such as the relative position of the autonomous vehicle in a lane at the time of the collision or near collision (e.g. right lane of a three-lane road, two meters left of center). In this regard, the speed, orientation, and other characteristics may be converted to this neutral frame and applied to the object. As an example, other characteristics may include a relative position of the object with respect to the autonomous vehicle, such that the object will generally maintain the same relative position with respect to the autonomous vehicle during the simulation (where practicable). This may be especially useful in situations where the two objects are traveling in the same direction. In addition, a similar time of collision between the initial situation and the new simulation may be used as a point of reference, and the system may interpolate backwards to the beginning of the new simulation using the characteristics of the object in the initial situation. In this regard, the object would follow the same trajectory in the new simulation as in the initial situation.

In some situations, the speed and acceleration of the object and the autonomous vehicle may be adjusted in order to make the new simulation more realistic. For example, if the autonomous vehicle is going slightly faster in the new simulation than in the initial situation, the speed of the object may also be increased accordingly. As another example, an oncoming object that runs a red light and hits an autonomous vehicle during a turn. In this case, the speed of the object may remain the same as in the initial situation (as only the timing of the collision may be important) or may be adjusted, for example by fuzzing, in order to increase the variability of a plurality of new simulations. As another example, where another object is approaching the autonomous vehicle in an adjacent lane in order to overtake the autonomous vehicle, and the autonomous vehicle cuts into that adjacent lane in front of the other object, the speeds of each of the autonomous vehicle and the object may be adjusted in order to improve realism, for instance, so that the object is still moving fast enough to overtake the autonomous vehicle. Moreover, in addition to inserting the object in the new simulation using a neutral frame of reference, that same frame of reference may be used throughout the simulation. By doing so, the position of the object over time relative to the autonomous vehicle may be fixed such that the object always stays at the same relative position with respect to the autonomous vehicle. This may be especially useful in situations in which the autonomous vehicle and the object are traveling in the same direction.

Returning to FIG. 8, at block 840, the new simulation is run in order to evaluate the autonomous vehicle control software. The new simulations may then be run in order to evaluate the software and determine whether the new simulations would result in a collision or near collision with different versions of the software and/or to make a likelihood determination or to otherwise gauge the severity or related problems in similar situations. This may be used to identify bugs or other issues with the software and direct efforts to improve the software.

The features described herein may provide for a wider variety of simulations when evaluating software for controlling autonomous vehicles in an autonomous driving mode. The new simulations described herein may be generated on a much larger scale than those that are generated manually by human operators. For instance, without such features, human operators would need to create software code or develop algorithms that interpret the scene to understand what's going on in a certain situation which can require a lot of iterations to achieve realistic simulations. This may be time-consuming and therefore costly in terms of resources. Moreover, an object and its behavior can be replicated to all of the one or more similar situations identified in the log data. This may allow the system to automatically generate realistic simulations with very little involvement by human operators making the process very scalable. In addition, given the nature of these new simulations and the increased number of simulations available for evaluating, the system may be more readily able to identify high-severity bugs in the software or other issues relating to how the vehicle responds to other road users (e.g. reckless drivers, etc.) using the new simulations.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method of generating simulations in order to evaluate software used to control autonomous vehicles in an autonomous driving mode, the method comprising:

identifying, by one or more processors, an initial situation involving a certain kind of interaction between a vehicle operating in the autonomous driving mode and an object;

conducting, by the one or more processors, a search of simulated data in order to identify data for one or more similar situations based on characteristics of the initial situation;

generating, by the one or more processors, a new simulation using the identified data by inserting the object from the initial situation into the one or more similar situations; and running, by the one or more processors, the new simulation wherein the new simulation comprises controlling a virtual autonomous vehicle in the autonomous driving mode in a recreation of an environment from the identified data including the object and the new simulation is run in order to evaluate performance of the software in the new simulation.

2. The method of claim 1, wherein the simulated data is generated by a human operator.

3. The method of claim 1, wherein conducting the search includes identifying a set of constraints and wherein the one or more similar situations include characteristics that meet ones of the set of constraints.

4. The method of claim 3, wherein the set of constraints includes a lane width.

5. The method of claim 3, wherein the set of constraints includes a number of lanes.

6. The method of claim 3, wherein the set of constraints includes a speed of the vehicle operating in the autonomous driving mode.

7. The method of claim 3, wherein the set of constraints includes a trajectory of the vehicle operating in the autonomous driving mode.

8. The method of claim 1, wherein the initial situation includes the vehicle operating in the autonomous driving mode merging.

9. The method of claim 1, wherein the initial situation includes the vehicle operating in the autonomous driving mode making a turn in front of a bicyclist.

10. The method of claim 1, wherein the initial situation includes the vehicle operating in the autonomous driving mode making an unprotected turn.

11. The method of claim 1, wherein the initial situation includes the object cutting in with the vehicle operating in the autonomous driving mode.

12. The method of claim 1, wherein generating the new simulation includes using a neutral frame of reference for the new simulation.

13. The method of claim 12, wherein the neutral frame of reference includes a location of a simulated vehicle for the new simulation relative to a lane.

14. The method of claim 12, wherein generating the new simulation includes converting characteristics of the object in the initial situation to the neutral frame of reference.

15. The method of claim 1, wherein generating the new simulation includes inserting the object into the one or more similar situations and interpolating backwards towards a beginning of the new simulation using characteristics of the object from the initial situation.

16. The method of claim 1, wherein generating the new simulation includes having the object follow a same trajectory in the new simulation as in the initial situation.

17. The method of claim 1, wherein generating the new simulation includes adjusting a characteristic of the object in the new simulation based on a characteristic of the vehicle in the one or more similar situations.

18. A system for generating simulations in order to evaluate software used to control autonomous vehicles in an autonomous driving mode, the system comprising one or more processors configured to:

identify an initial situation involving a certain kind of interaction between a vehicle operating in the autonomous driving mode and an object;

conduct a search of simulated data in order to identify data for one or more similar situations based on characteristics of the initial situation;

generate a new simulation using the identified data by inserting the object from the initial situation into the one or more similar situations; and run the new simulation wherein the new simulation comprises controlling a virtual autonomous vehicle in the autonomous driving mode in a recreation of an environment from the identified data including the object and the new simulation is run in order to evaluate performance of the software in the new simulation.

19. A non-transitory computer readable medium on which instructions are stored, the instructions, when executed by one or more processors cause the one or more processors to perform a method for generating simulations in order to evaluate software used to control autonomous vehicles in an autonomous driving mode, the method comprising:

identifying an initial situation involving a certain kind of interaction between a vehicle operating in the autonomous driving mode and an object;

conducting a search of simulated data in order to identify data for one or more similar situations based on characteristics of the initial situation;

generating a new simulation using the identified data by inserting the object from the initial situation into the one or more similar situations; and running the new simulation wherein the new simulation comprises controlling a virtual autonomous vehicle in the autonomous driving mode in a recreation of an environment from the identified data including the object and the new simulation is run in order to evaluate performance of the software in the new simulation.

* * * * *